United States Patent [19]

Aspden

[11] Patent Number: 5,376,184
[45] Date of Patent: Dec. 27, 1994

[54] THERMOELECTRIC HEAT TRANSFER APPARATUS

[76] Inventor: Harold Aspden, Acres High, Hadrian Way, Chilworth, Southampton SO1 67HZ, England

[21] Appl. No.: 18,281

[22] Filed: Feb. 16, 1993

[30] Foreign Application Priority Data

Jun. 17, 1992 [GB] United Kingdom ............... 9212818

[51] Int. Cl.$^5$ ............................................. H01L 35/32
[52] U.S. Cl. ............................. 136/203; 136/204; 136/224; 136/225; 62/3.2; 62/3.3; 62/3.7
[58] Field of Search ............... 136/200, 203, 204, 205, 136/208, 225, 242, 224; 62/3.2, 3.3, 3.7

[56] References Cited

U.S. PATENT DOCUMENTS

| | | | |
|---|---|---|---|
| 1,809,475 | 6/1931 | Dowles, Jr. | 315/55 |
| 2,139,504 | 12/1938 | King | 158/28 |
| 2,919,553 | 1/1960 | Fritts | 62/3 |
| 2,944,404 | 7/1960 | Fritts | 62/3 |
| 2,981,775 | 4/1961 | Bachman | 136/5 |
| 3,211,214 | 10/1965 | Chambers | 165/28 |
| 3,289,422 | 12/1966 | Fisher | 62/3 |
| 3,319,457 | 5/1967 | Leone | 73/17 |
| 3,343,009 | 9/1967 | Wagini et al. | 310/4 |
| 3,441,449 | 4/1969 | Green | 136/203 |
| 3,460,015 | 8/1969 | Hines | 318/117 |
| 3,547,705 | 12/1970 | Heard, Jr. | 136/203 |
| 3,977,904 | 8/1976 | Köhler | 136/89 |
| 4,483,341 | 11/1984 | Witteles | 128/402 |
| 4,786,335 | 11/1988 | Knowles et al. | 136/214 |
| 4,828,627 | 5/1989 | Connery | 136/203 |
| 5,065,085 | 11/1991 | Aspden et al. | 322/2 R |
| 5,101,632 | 4/1992 | Aspden | 60/643 |
| 5,288,336 | 2/1994 | Strachan et al. | 136/200 |

Primary Examiner—Donald P. Walsh
Assistant Examiner—Chrisman D. Carroll

[57] ABSTRACT

Heat transfer apparatus, whether in panel or tubular form, comprises bimetallic laminations, at least one of the metals being ferromagnetic. A temperature differential causes thermoelectric current circulation (in effect, a d.c. eddy-current) within each lamination which develops a magnetizing H-field. A transverse electric potential may also be used to enhance thermoelectric activity across a bimetallic junction. The ferromagnetic B-field enhancement develops in turn a circulating diamagnetic reaction current which augments the thermoelectric activity and causes an overriding thermal feedback and bistable direction-of-heat-flow operation. Control involves the priming action of an applied electric and/or magnetic field or preheating by electrical resistors in the heat sinks. Application in a thermally powered electric transformer generator is described.

5 Claims, 6 Drawing Sheets

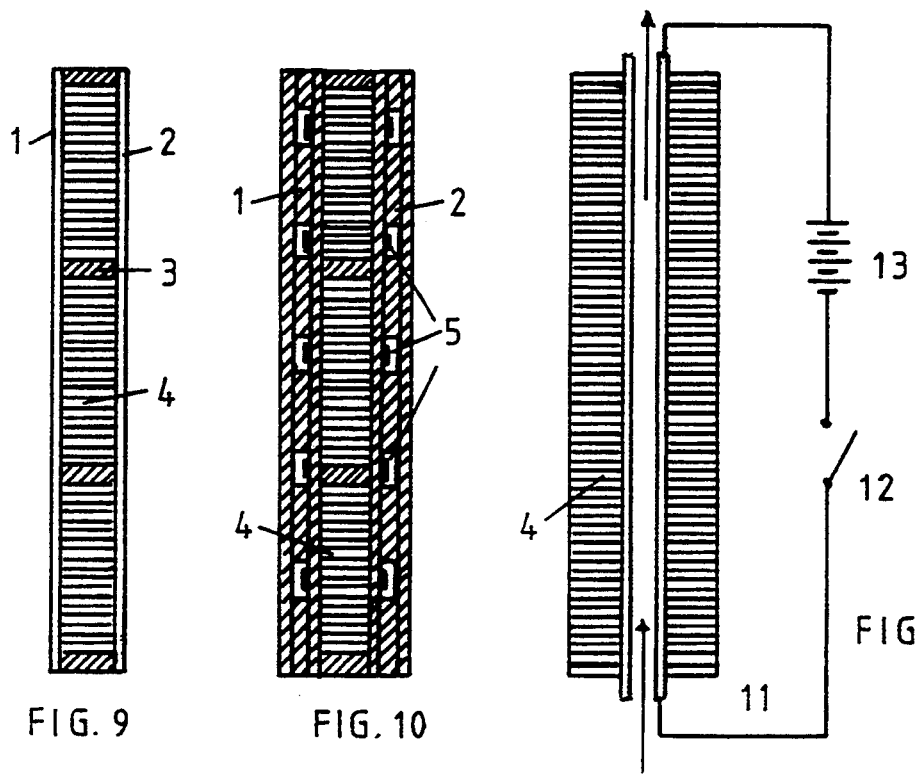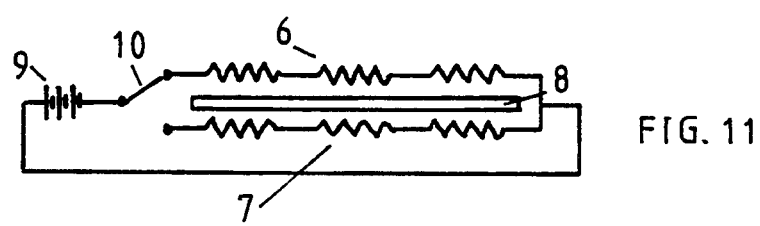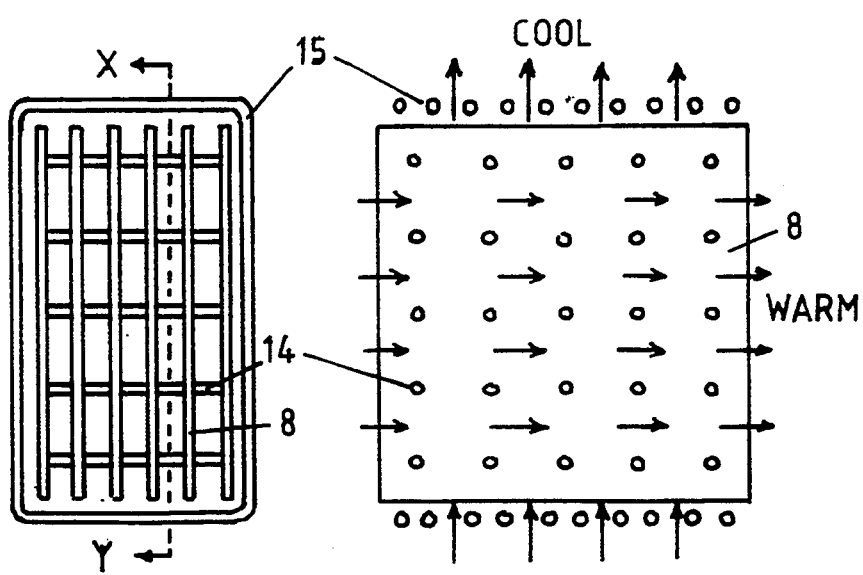

THERMOELECTRIC HEAT TRANSFER APPARATUS

FIELD OF INVENTION

This invention relates to thermoelectric heat transfer apparatus which harnesses electrical processes occurring within metals when subjected to mutually transverse electric and thermal potential gradients.

This is a field concerned with the physics of the Thomson Effect, along with the Peltier and Seebeck Effects, but in concerns also the nature of charge displacement in metals and thermodynamics generally.

BACKGROUND OF THE INVENTION

The invention arises from research on the diagnostic testing of a device, the subject of pending U.S. patent application Ser. No. 07/439,829 now U.S. Pat. No. 5,288,336, in respect of which the Applicant is a co-inventor. Prototypes of that device were found to have what seemed to be inexplicably-high operational efficiency, freezing water virtually instantaneously when powered by electricity. They comprised what may be termed a 'series capacitor stack' formed by layers of a substrate dielectric metal, each coated using different metals (a layer of nickel and a layer of aluminium) and assembled between two metal plates which formed heat sinks.

The flow of heat through the bimetallic aluminium:-nickel metallized layers from a hot heat sink to a cold heat sink caused the internal circulation of a thermoelectric current within each layer. The device operated with an astonishing efficiency by virtue of an electrical oscillation set up in the stack in a direction transverse to the heat flow direction and, indeed, transverse to what, in a conventional thermopile, would be the main Peltier EMF powered current path, but which in this prototype device was merely the local current circulation due to the secondary action of the Thomson effect. Research investigation indicated that this oscillating current activated the device in a most unusual way, primarily in interrupting the thermocouple junction currents at the oscillation frequency, an action which was found to enhance the thermoelectric EMF enormously. Compared with the normal thermo-electric EMF of 17 $\mu$V/K for an aluminium:nickel thermocouple, an EMF of the order of 300 $\mu$V/K resulted with the A.C. dynamic excitation at kilocycle frequency.

This led in the prototype research to the construction of extremely efficient thermopiles in the form of a capacitor stack with its heat throughput axis in one direction and the A.C. electric power throughput axis in the transverse direction. The device operated with high efficiency as a solid state heat pump powered directly by electricity or, when subjected to a temperature differential, as an electric power generator. Indeed, the device at room temperature demonstrably operated an electric motor when powered by melting ice and similarly would freeze water when powered by electrical input from a small battery.

The background of this subject invention is, therefore, the above prototype research using transverse oscillating A.C. field excitation in conjunction with the thermoelectric D.C. circulation in thin bimetallic layers forming capacitor plates in a series-connected stack.

The advance which is of primary importance and which is introduced by this invention to distinguish it from the disclosure in the above-referenced patent specification comes from a research investigation into the mysterious feedback process which must be present to give account of the extremely high efficiency observed.

The feedback feature has two aspects which relate respectively to a catalytic heat transfer role played by electric field priming and/or magnetic field priming and, it would seem an aspect common to both, as an action whereby an electric field mutually orthogonal in direction to both a heat flow axis and a magnetic field can regulate the heat transfer role of the magnetic field.

The physical basis of such feedback will be explained as the invention is described in detail but to distinguish its novelty and meritorious features from the published art it is noted that all prior art thermoelectric devices operate in D.C. mode. The current flow through the thermopile of such devices is direct current because the heating and cooling functions interchange at each junction if alternating current is used.

It has been suggested that a thermocouple can operate at high frequency but the action was still basically a direct current action, though one operating at a pulsation frequency. This is the proposal in U.S. Pat. No. 1,809,475 (Inventor R. B. Dowler), where the series circuit through a conventional thermopile arrangement was shown to be assembled in what appears to be a grid-controlled vacuum tube in which the grid is powered by a signal from a resonant circuit. The current through the thermopile passes through the anode-cathode path and so would be subject to the radio-frequency oscillations regulated by the grid control.

Another prior art disclosure of interest is that of inventor Hines in U.S. Pat. No. 3,460,015 which shows two metallic layers having a contiguous interface and sandwiched by insulation between two metal bodies which are to be moved slightly relative to one another in a position control system. The metals mentioned were iron and copper. The displacement was caused by thermal expansion which is a function of the heating or cooling of the bimetallic layers. Here, by passing a direct current one way or the other through the bimetallic layer, the junction formed between the layer is heated or cooled and so the system adjusts. However, though this is an arrangement in which a sandwich structure of insulation and two metals is used, the function is that of a single excited D.C. powered junction. The thermocouple, as such, involves complementary junctions which lie outside the part of the system which is to be moved by thermal expansion or contraction, so that a control that involves heating in the operational part of the system is matched by an external dissipatory function that involves the counterpart cooling.

One of the embodiments of the invention to be described involves metal fins which protrude from the capacitor stack alternately on opposite sides to provide a heating and cooling interface with air or other gas used to facilitate heat transfer. This may resemble a proposal in Japanese Patent Application No. 63-257564 (Applicants: Matsuchita Electric Ind. Co. Ltd.), but an important distinguishing feature is present in the subject invention.

Reference is also made to the disclosure in U.S. Pat. No. 5,065,085 of which this Applicant is a co-inventor. That disclosure concerns the enhancement of thermoelectric action in an energy converter involving A.C. oscillations in bulk metal structures subjected to a magnetic field. The research and development effort arising from that project has, however, concentrated more on the techniques of fabrication of what is specifically described in the copending U.S. patent application already referenced, which, together with the invention to be described below, offers certain advantages.

BRIEF DESCRIPTION OF THE INVENTION

According to one aspect of the invention, thermoelectric heat transfer apparatus comprises a first heat sink, a second heat sink and a laminated assembly in which each lamination comprises two interfacing substances which have metallic conduction properties but different polarity thermoelectric properties, their interfacing relationship being that of a contiguous structure whereby an electric barrier potential may exist across the interface and act thermodynamically upon current traversing the interface, the laminations being sandwiched between plate electrodes but electrically isolated and insulated therefrom by dielectric insulator layers and arranged between the heat sinks with opposite edge surfaces in thermal contact with the surface of the first and second heat sinks, respectively, there being electrical voltage control means arranged to apply an electric voltage between the plate electrodes, thereby displacing electric charge carriers at the bimetallic interface to set up a junction potential across that interface which supplements the thermoelectric Peltier EMF between the metals, and the electric voltage control means having a circuit productive of a voltage having a d.c. voltage component and a superimposed a.c. voltage component, the d.c. voltage component exceeding the amplitude of the a.c. voltage component, whereby inflow of a.c. current through the capacitance of the assembly activates and sustains thermoelectric current circulation within each lamination by establishing a temperature differential between the heat sinks by thermoelectric action enhanced by the d.c. voltage component.

According to another aspect of the invention, thermoelectric heat transfer apparatus comprises a first heat sink, a second heat sink and a laminated assembly in which each lamination comprises two interfacing substances which have metallic conduction properties but different polarity thermoelectric properties, their interfacing relationship being that of a contiguous structure whereby an electric barrier potential may exist across the interface and act thermodynamically upon current traversing the interface, the laminations being sandwiched between plate electrodes but electrically isolated and insulated therefrom by dielectric insulator layers and arranged between the heat sinks with opposite edge surfaces in thermal contact with the surface of the first and second heat sinks, respectively, there being electrical voltage control means arranged to apply an oscillatory electric voltage between the plate electrodes, thereby displacing electric charge carriers at the bimetallic interface to set up a junction potential across that interface which supplements the thermoelectric Peltier EMF between the metals, and there being magnetic control means independent from, but controlled to operate at the same frequency as, the voltage control means connected to activate and sustain current circulation within each lamination.

According to a third aspect of the invention, thermoelectric heat transfer apparatus comprises a first heat sink, a second heat sink and a laminated assembly in which each lamination comprises two interfacing substances which have metallic conduction properties but different polarity thermoelectric properties, their interfacing relationship being that of a contiguous structure whereby an electric barrier potential may exist across the interface and act thermodynamically upon current traversing the interface, the laminations being arranged between the heat sinks with opposite edge surfaces in thermal contact with the surface of the first and second heat sinks, respectively, there being external electrically powered circuit control means arranged to produce a polarizing bias at the junction interface, and there being electrically powered priming control means independent from the externally powered circuit control means by which to activate and sustain thermoelectric current circulation within each lamination by establishing a priming temperature differential between the heat sinks.

Other features of the invention will be evident from the following description.

BRIEF DESCRIPTION OF THE DRAWINGS

FIG. 9 shows a panel structure according to the invention.

FIG. 10 shows a panel structure incorporating heating elements.

FIG. 11 shows schematically an electrical circuit including a two-way switch for selecting the heat priming direction of a panel such as that shown in FIG. 10.

FIG. 12 shows a tubular structure according to the invention with an electric circuit connected to provide core heating.

FIG. 13 shows a multi-panel assembly within a magnetic coil which can provide magnetic field control of panel heat transfer operation.

FIG. 14 shows a sectional side view of the assembly of FIG. 13 through the section denoted X-Y in FIG. 13.

DETAILED DESCRIPTION OF THE INVENTION

Figure 1:
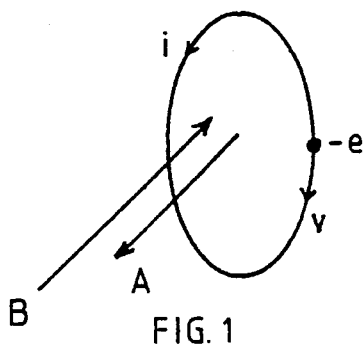
FIG. 1 depicts an electron deflected into an orbital motion by a magnetic field.

Thermocouple junctions are formed between two metals and the flow of current I around a circuit including these junctions relates to a Peltier cooling effect at one junction and a Peltier heating effect at the other junction, these junctions being at different temperatures $T'$ and $T$, respectively.

There is also a Thomson heating or cooling effect in each metal between the junctions, depending upon the polarity of the free charge carriers in the metal.

There will further be joule heating or ohmic heating, owing to any current flow through the metal that derives from the Peltier generated EMF rather than the Thomson Effect, inasmuch as the latter derives directly from the transport of heat by thermally activated migration of electric charge.

For the following general analysis the Thomson action and the joule heating will be ignored, but it is recognized that these imply loss which is detrimental to efficiency of a thermocouple used to convert heat and electricity. Note, however, that with current excitation of a thermopile transverse to a thin bimetallic film carrying heat in its plane, the circuit resistance in the transverse direction is minimal, meaning negligible joule heating. Also, the heat flow is, by the action of the Thomson Effect, a carrier of electric current that involves no associated joule heating loss drawing on any electric power generated by Peltier action. It is assumed that the two metals are respectively electropositive and electronegative so that heat energy input generates a circulating Thomson current I and that the Peltier EMF is deployed to sustain current flow in a direction transverse to the plane of the bimetallic film under consideration.

If the Peltier coefficient is denoted $\epsilon$, the cooling effect at the $T'$ junction is $\epsilon I T'$ and the heating effect at the $T$ junction is $\epsilon I T$. The power difference is converted into electrical power and represents the 'output' derived from heat input $\epsilon I T'$. From this it is seen that the ideal efficiency at which heat can be converted into electricity is $(T'-T)/T'$, which is known as the 'Carnot efficiency'.

In practice, conventional thermocouple technology seldom offers more than about 10% efficiency and that is only where semi-conductor materials are used and these have very limited power throughput capacity given their size and cost.

The subject technology with which this Applicant has been involved, namely via research arising from devices built using the principles of the above-referenced patents, demonstrably performs at a 73% efficiency. This is an overall performance taking full account of joule heating and heat conduction loss and based on the external heat sink interface temperatures, which must be significantly higher than those operative at the junctions. The Applicant therefore knows that there has to be some physical heat-feedback process at work in the devices that were under test and this motivates research investigation to establish the true nature of that process and find ways in which to enhance it to secure improvements in the technology.

Looking, therefore, at the theoretical derivation of the above efficiency formula and noting that the structure of the tested devices included provision for a superimposed alternating current flow and used a metal that was ferromagnetic, it is appropriate to consider the possibility that either a magnetic field or an electric field or both could affect the junction heating and cooling in a special way.

It is evident, from one viewpoint, that the action of the electric field would need to be local to the bimetallic interface over a limited range, probably related to the mean free path of the charge carriers, so that, in potential terms it would be an EMF, which we denote V. Its action would be to heat the junction where I flows in the V direction and cool the junction where I flows against the V direction. However, if V oscillates, the expectation is that this would heat and cool each junction cyclically in successive oscillation periods, with no gain but an overall parasitic loss effect.

The effect of magnetism is not so easily presented. A magnetic field can displace a current and charge laterally by Lorentz force action or the Hall Effect but that does not involve heating or cooling. However, a reason for a magnetic effect acting selectively on the junctions will be presented below. Meanwhile, the electric field effect may be seen to alter the action at the junctions to cause heating at a rate which is $(V - \epsilon T')I$ at the $T'$ junction and cooling at the rate $(V + \epsilon T)I$ at the $T$ junction.

When this heating and cooling action is factored into the derivation of the operational efficiency, it is found that energy has to be supplied or deployed according to the normal Carnot criterion, meaning that the amounts of heating and cooling must be different if there is a temperature difference. However, supplementing the Carnot heat transfer action there is additional feedback of heat throughput at the rate VI and this does not demand power from the source of V, meaning that the presence of the EMF is to generate a catalytic heat transfer action.

With V positive in the I direction at T', the theoretical efficiency or coefficient of performance in heat pump mode is $(V + \epsilon T')/(T' - T)$ which is greater than the Carnot value by the added factor $V/\epsilon T'$. In Seebeck electric power generating mode, the efficiency of heat conversion to electricity is similarly affected. So long as electric power is drawn off and current flows there will be thermal feedback enhancing the efficiency. When generating electricity one can, therefore, think in terms of true thermal efficiency with high percentage conversion efficiencies at moderate temperatures.

However, this depends upon that EMF V actually existing and being unidirectional at the thermocouple junction interface. This invention is based on the indications from experimental research that a field effect corresponding to V does, in fact, exist, either in the metal proper or, as just discussed, at the interface between two base metals of opposite polarity thermoelectrically and that very high efficiencies of energy conversion are achieved.

Now, before describing an embodiment of the invention which exploits this V field effect, the role of a magnetic field will be discussed.

It must be recognized that when a thermoelectric current circulates around a bimetallic lamination this current can produce a magnetic field. This current develops the H-field analogous to the action of an energizing solenoid, but the central portion of that bimetallic lamination has become the core of that solenoid. Now, if, and only if, one of the two metals is ferromagnetic this H-field will develop a B-field of much greater intensity in the ferromagnetic section of that lamination. This is because of the high magnetic permeability and, the lamination being elongated in the magnetization direction and having relatively small thickness, any self-demagnetizing actions are not significant.

Given this situation, one then needs to take note of the fact that, in the history of electrical science, there arose the problem as to why the numerous free conduction electrons in metals, which move at extremely high Fermi speeds and are the seat of thermal energy implying motion related to temperature, do not appear to react diamagnetically. They ought to react to such an overpowering extent that they virtually suppress penetration of any steady magnetic field. The electron orbits, if the charge involved is really 'free', are of relatively large radius and, even though of micron dimension, one can calculate that the currents associated with the orderly reaction of free conduction electrons in just a cubic centimeter of normal metal in a normal magnetic field is circuital and of the order of billions of amps. Physicists convinced themselves that what really happens is that the electrons in the body of the metal all move in the same reacting sense and do set up an enormous back-reacting field, but those electrons that encounter the inner bounding surface of the metal are deflected around the perimeter in a counter-magnetizing direction. An extremely high back-reaction is deemed from their analysis to be exactly balanced by the forward field action of the boundary current. Noting that this is an action supposedly involving billions of amps one must wonder how this scenario affects thermoelectric action if just a very small fraction of that boundary current happens to be in a composite bimetallic ferromagnetic metal structure.

The authoritative textbook on the subject is that of J. H. van. Vleck entitled "The Theory of Electric and Magnetic Susceptibilities", published by Oxford University Press. In the 1966 edition at page 100 this book describes the absence of free electron diamagnetism in classical theory and at page 353 begins the description leading to the same conclusion by argument using quantum mechanics.

The Applicant has, however, for nearly forty years, been advocating the need to challenge this standard explanation for the absence of what is known as 'free electron diamagnetism'. There is an alternative scenario based on field energy equilibrium and minimal energy optimization, combined with the reality of regarding those free conduction electrons as still subject to a continuum of positive charge in the metal. The latter is set up by the residual charge of the nuclei of the atoms which supply those free electrons, albeit smeared into a uniform continuum effect by the random motions of the other free electron population. What this means is that, whereas the source magnetic field (the H-field as augmented to produce the B-field) will deflect the electron motion into reacting orbits there will normally be a very much stronger deflection owing to that positive charge. The reacting electron orbits will involve free electrons which have left the normal confines of the atomic state, but, though they are still quite close to the atoms, they adopt a motion by which they are, on average, subject to restoring forces linearly proportional to displacement from an attracting centre. Now, at the boundaries of a metal, particularly in a ferromagnetic metal, where the magnetic polarization and so the B-field fades away, those free electrons can only sense positive charge seated within the body of the metal. They move around that charge in their reacting motion. They cannot sense positive charge or magnetic field action from a source outside the metal, because it does not exist, unless, of course, the metal abuts against another ferromagnetic substance.

Therefore, there is no way in which all the electrons can retain the same orderly type of motion right up to the metal boundary. They cannot possibly all be part of a concerted migration of electric charge tracking around the inside of the metal boundary which provides precise balance for the magnetic reaction in the core of the system. They cannot therefore develop, in full and perfect measure, that billion amp reaction current which supposedly completely cancels the overwhelming diamagnetic core action in what, by the theorems on the subject, is deemed to be such a perfect balance that there is not the slightest trace of any free electron diamagnetism.

What this Applicant has been advocating in his published theoretical work (for example at pp 36-40 in the book "Physics Unified", published in 1980 by Sabberton, P.O. Box 35, Southampton, England under the standard book reference ISBN 0 85056 0098) is that one must recognize that there are overriding energy optimisation constraints which limit the boundary current migration. The core field reaction exists but under circumstances which permit it to pass unnoticed, except for revealing itself as the g-factor-of-2 anomaly one associates with gyromagnetism in ferromagnets. Based on the Applicant's research findings, one is, of course, not dealing with true billion amp reaction currents, but certainly one can, under very special circumstances, begin to contemplate, under very extreme magnetization conditions, a thermodynamically powered non-compensated 10,000 amp reaction current flow per centimeter measured in the field direction, a value commensurate with the B-field polarization of magnetically-saturated ferromagnetic metals.

The gist of the Applicant's findings is that when one applies an H-field to a ferromagnetic metal to develop its B-field polarization, that B-field owes its primary action to a field of double its strength, because the free conduction electrons in the metal absorb potential energy from the positive charge interaction to deploy a maximum amount of energy into the reaction. This is easily shown in mathematical terms (as in the Appendix incorporated in the specification of the specification of GB Patent application No. 9212818.0, filed Jun. 17, 1992, which is a priority claimed by this U.S. Application) to involve a reaction of half the primary action, meaning that a circulating current attributable to the thermodynamically-powered free conduction electrons in the metal must be present. The strength of the B-field seems not to be reduced by that reaction, simply because one has really underestimated the primary action by a factor of two and because the reaction reduces the polarization to half of its primary value, meaning to the level one measures as the B-field strength.

This phenomenon is really what underlies the anomaly observed in measurements of the change of magnetic moment in relation to angular momentum when the magnetism of a ferromagnetic rod specimen is reversed. One expects that the ratio would be e/2m, where e is the electromagnetic charge of the electron and m is electron mass. Experimental measurement shows that ratio to be e/m, that is twice that predicted theoretically. However, if the reaction theory which this Applicant profers is applied to the argument, then it is the observed e/m ratio that is to be expected.

Physicists in science history erred first in developing a false argument to explain why they could not sense free electron diamagnetism and then they erred again, so far as concerns bulk ferromagnetism, in explaining the g-factor-of-2 anomaly in terms of an abstraction known as 'half-spin'. When they turned attention to thermodynamic effects and particularly studied the Thomson Effect in nickel and iron, they erred again in discounting the research findings of Doffman, Jaanus and others, who had developed a theory which fitted actual measurements but gave results of opposite sign and depended upon ferromagnetism being due to free conduction electrons. They failed to see the connection with the diamagnetic reaction field that was of opposite sign but of equal intensity to the forward residual B-field. The latter research was discussed on p. 370 of the book "Modern Magnetism" by L. F. Bates, 4th Edition as published in 1961 by Cambridge University Press.

The standard assumption by the physicist is that the Fermi-Dirac statistics impose quantum conditions so that all the electrons are regulated in a way which avoids magnetic reaction and so feedback effects. Yet such reaction is essential if one is to understand how energy stored by magnetic induction can be recovered when an electrical system is switched off. In fact, though almost all of the energy of motion of free electrons is compliant with the ordering of the Fermi-Dirac effects there remains a residue that involves thermal activation and also an imbalance of the bulk magnetic reaction and boundary magnetic action.

All this has, of course, deflected innovative technology away from the possibility of exploiting the thermodynamic properties of reaction current phenomena in ferromagnetic metals. It is only now, in presenting this invention, that the technological inspiration has emerged to allow certain heat transfer anomalies now observed to be traced to action which has become the subject of this invention.

In short, a thermoelectrically-generated circulating current in a bimetallic lamination produces an H-field. If the lamination is wholly composed of ferromagnetic metals, differing in thermoelectric properties so as to still set up that internal heat-generated H-field, then a B-field will result and a consequential half-field reaction which is here termed the 'A-field'. The intrinsic B-field is sourced in atomic electrons in the 3d atomic level and these are locked well inside the individual atoms. These electrons cannot traverse the junction interface between the two metals and so cannot affect any heat transfer thermoelectrically. However, the A-field reaction is manifestly a free conduction electron current moving through the metal as a whole and this A-field current, which is of 10,000 amp per cm strength, must be able to participate to some limited extent in that thermoelectric action.

The importance of this from a technological viewpoint can be seen if it is noted how thermoelectric currents are produced. Take two junctions P and Q in a thermocouple circuit. When junction P is supplied with heat and junction Q is kept cool, a thermoelectric current will circulate around the circuit to cool P and heat Q. Suppose that this circulation is clockwise and that it produces the H-field which magnetizes a bimetallic lamination composed of two ferromagnetic metals. The B-field will be in the same direction as the H-field. Therefore, the A-field reaction effect will be opposite and it will involve that enormous current flow in an anti-clockwise direction. An effective magnetic permeability of 2,000 could mean that the A-field anti-clockwise current flow will be 1,000 times the strength of the H-field clockwise current flow. Now, if the A-field current really flows around that same general circuit path, it will heat the junction P and cool the junction Q.

In other words, if heat is supplied to P from an external source, heat will be conducted into the metal but the thermoelectric current will produce an H-field which activates an A-field reaction. This reaction will take heat from the metal and bring it back to the vicinity of P, so that, even allowing for thermal conduction loss, there may seemingly be far more heat feedback than was supplied from the external source in the first instance. This heat feedback is under the control of the processes which govern and sustain the ferromagnetic state and these include thermodynamic actions and magnetocaloric actions in the metal. The action conserves energy but it does so by deploying heat energy in a way which can mean useful technological application. This especially means that it is possible to devise thermoelectric devices which are far more efficient in converting heat into electrical energy and vice versa. It has bearing upon the proven performance of research prototypes already mentioned. A description of this prior activity, written by this Applicant, has appeared in the July 1992 issue of the U.K. periodical Electronics World, pp. 540–542, but it is stressed that the structures there reported did not include bimetallic all-ferromagnetic laminations. The metal combination of the prior disclosure was aluminium and nickel. Nor did that disclosure reveal the techniques by which to enhance, control and sustain the power conversion and heat transfer processes which feature in the invention to be described below.

Therefore, the full B-field effect could not be present in the device there described and in a way which developed thermal effects arising from the A-field reaction in metal or across the interface between the two metals.

It is important to stress that the mere presence of a magnetic field acting on a bimetallic all-ferromagnetic lamination will not develop the thermoelectric A-field current across the interface between the metals. The current is powered thermodynamically, as is the Peltier EMF across the junction interface. The latter represents a state of equilibrium as between the free charge carriers in the two metals and that Peltier EMF will prevent A-field current flow across the interface and allow only the normal thermoelectric current to flow when there is a temperature gradient along the interface.

The A-field currents are represented by two separate thermally driven current loops, each in its own metal. These loops can only become merged into a single circuital loop crossing the metal interface if a potential such as that denoted V above or a transverse current flow is active to overcome the Peltier EMF.

In some measure, therefore, the action of feeding external power into a electric field transverse to the bimetallic interface can serene, not just as a catalyst effect via the V potential analysed above, but further in causing the magnetic field B to serve also as a catalyst producing a current circulation that assists in the heat energy transfer. Also, as will be shown by later reference to the Nernst-Ettinghausen Effect, a transverse electric field set up within metal, as opposed to an interface region between two metals, could act as a control switch regulating the heat feedback.

From this discussion one can expect the ferromagnetic lamination to develop a degree of polarization or residual magnetism which will determine which thermoelectric junction in the circuit of the lamination tends to heat and which tends to cool. It means a junction may heat or cool under the control of an overriding applied magnetic field according to the field direction. Similarly the polarity of the field associated with the V potential can determine the action, inasmuch as VI is a measure of the heating or cooling, where I is the relevant circulating current.

Before describing implementation of these principles in embodiments of the invention, two research test observations are here noted. These apply to a bimetallic test structure in which only one of the metals was ferromagnetic, but where magnetic leakage flux from the ferromagnetic metal would spread into the other metal. A thermoelectric device was tested by applying ice to one junction heat sink with the other heat sink at room temperature. As the ice melted electric power was drawn off from the thermocouple circuit by encouraging transverse current oscillations through a capacitor system. After the ice had melted, an electric power source was used to encourage oscillations in that transverse sense. This reversed the action but, had the device not been primed in some way, there was no conventionally logical way in which the operation by this input a.c. excitation could determine which side of the device would heat and which side would cool. The action ought, one would think, to have a random choice, owing to the symmetry of the structure and its excitation. As it was, the side on which the ice had melted in the heat-to-electricity conversion mode was, invariably, the side on which ice was reformed from the water derived from the melted ice.

Secondly, an experiment in which a magnetic field was applied to a thermoelectric junction involving nonferromagnetic metals did cause that junction to perform asymmetrically in response to an oscillatory current .. When a.c. current was flowing through the junction, then, dependent upon the polarity of the magnetic field, the junction would either heat or cool.

This invention, in its preferred embodiments, therefore aims to exploit this effect to the full by utilizing bimetallic laminations that are wholly ferromagnetic. It must be noted that A-field currents supposedly as high as 10,000 amps per cm length of junction might be expected to have enormous thermoelectric consequences, but one needs to put this in context. The thermo-electric Peltier heating and cooling at a thermocouple junction comes about because there are collisions between the charge carriers. If, therefore, the A-field reaction is composed of numerous circular current orbits having diameters very much smaller than the mean free path of those charge carriers, only a small fraction of the current crossing the boundary will be effective thermoelectrically. Even so, based on such a high A-field current flow, the effective action of a much reduced current can still have a very substantial effect upon the energy conversion efficiency. This residual effective action, together with the supplementary action of the V potential, is sufficient to sustain the important technological innovation offered by this invention.

Also, one needs to remember that within a ferromagnetic substance, even one that is a single crystal, there are naturally formed domain walls between magnetically saturated regions. It needs very substantial H-fields to bring the magnetic flux in these domains into alignment. The thickness of those domain walls can be sufficient to exclude the A-field current and such walls are effectively set up at the interface between two ferromagnetic metals. However, there has to be some measure of flux leakage penetrating the domain boundaries and the bimetallic junction interfaces under high flux conditions and the g-factor-of-two action described above means that a feedback effect at least equivalent to a current action commensurate with half the H-field strength has to be present.

This is a minimal condition and alone it will give basis for doubling the expected thermoelectric power conversion efficiency but more can be expected with high magnetic flux operation. The observed 73% of Carnot efficiency in the prototype device already mentioned is thereby brought into perspective.

Referring now to the drawings, when, in FIG. 1, a primary magnetic field action of intensity B acts on a free conduction electron of charge -e moving at velocity v across that B field, the electron is deflected into a helical motion which appears as a circular orbit viewed from the B direction. This action develops a current i in that circular orbit which sets up a reaction field, denoted by the symbol A.

Figure 2:
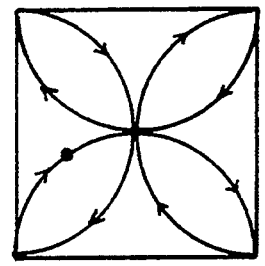
FIG. 2 portrays a single electron trajectory in a hypothetical host metal of square cross-section.
Figure 3:
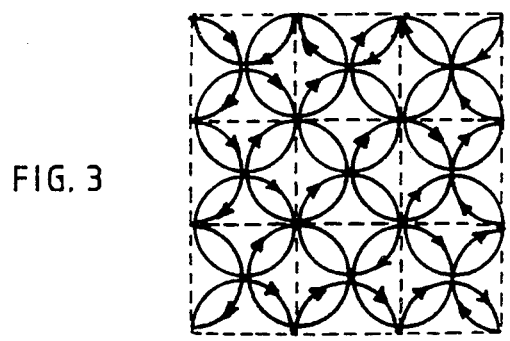
FIG. 3 portrays multiple electron orbital motions in a host metal of square section much larger in dimension that the orbit diameters.

The electron is deemed to be one of many billions of free electrons in a metal subjected to the B-field. All these electrons will orbit in the same direction to generate a back-field. Now, the physics teachings on this subject declare that the back-field is exactly compensated by the migration of the electron around the confining boundary of the host metal. FIGS. 2 and 3 aim to show why this doctrine has found support. Imagine the simplified situation where the metal is of square cross section and the electrons happen to be suitably positioned in the metal and subject to a B-field which causes them to orbit in circles of a diameter exactly equal to the side dimension of that square section. A possible electron flow path is illustrated. The electrons rebound upon collision with the boundary and migrate around the inside perimeter of the host metal. Note that at a corner the electron will really hit one side face or the other and will rebound to be immediately deflected into the other side face. This is how it makes its 90 degree turn.

As presented for this single element region, the electron will inevitably set up a back-reaction field but one must imagine two virtual perimeter currents in counterflow around the square boundary of strength equal to the electron current. One such flow will combine with the part-circular motion of the electron to represent flow around what amounts to two complete circle areas, whereas the other opposed action will be that of flow around the square. Allowing for the fact that the time taken for the electron to travel around two such circles in relation to the time for its notional companion to travel around the square in the opposite direction is proportional to distance travelled, it can easily be verified that the backward field-producing effect of the circular motion is precisely balanced by the forward field-action of the effective current flow around the square perimeter.

This translates on a larger scale into the situation presented in FIG. 3. Here the full circular reacting motion of electrons in the core of tile metal sets up the back-field and the balance arises from a migration around the outer perimeter in the opposite direction. The standard physics based on statistical analysis of this problem tries to give assurance that there is no net reaction effect attributable to free conduction electrons in metal subjected to that B-field.

The problem with this standard argument is that the whole theory is affected by those positive charges seated in atoms vacated by the free electrons. They interfere with the motion of the electrons and ensure that the electrons never orbit solely under the action of a magnetic field because the primary influence is that of the positive charges of the atomic lattice in the metal. Those electrons which move clockwise in the body of the metal cannot all move clockwise at the bounding perimeter in orbits of the same radius because there is no positive charge outside that boundary to constrain the motion in a clockwise sense. All the statistical arguments, including the Bohr-van-Leeuwen theorem developed to prove that there is no free electron diamagnetism, are ill-founded because they were attempts to explain an apparent situation, rather than a real situation.

Figure 4:
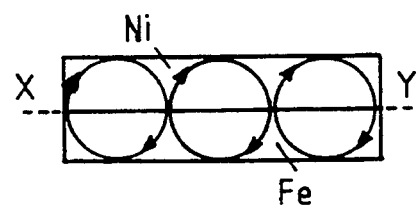
FIG. 4 shows how orbital electrons in a thin host bimetallic lamination develop a distribution of junction current in traversing the metal interface.

To correct the error one needs to regard at least some of the reacting electron motion as generally indicated by what is shown in FIG. 4. There is no reverse migration of electron motion around the inside boundary of a metal and, looking now at the condition across a bimetallic lamination junction interface X-Y in FIG. 4, assuming both metals are ferromagnetic, it can be seen that the net current action involves a flow across the junction interface in one direction near one side edge and in the opposite direction near the other side edge of the lamination. The two metals are denoted Fe and Ni to signify iron and nickel, respectively, is to be expected, therefore, that the reaction field will produce a net current flow, powered thermodynamically by the process which sustains the ferromagnetic state, and the current should develop its own thermoelectric heating and cooling by Peltier action if it is not obstructed from traversing the junction interface.

Figure 5:
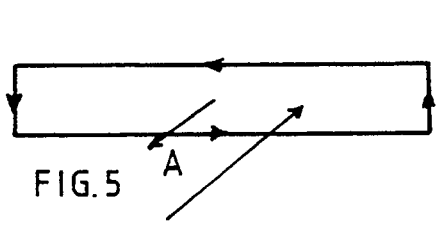
FIG. 5 introduces the concept of a reacting A-field current induced by an enhanced B-field.

Referring to FIG. 5, a rectangular current loop signifies the flow path of the current setting up the reaction A-field in opposition to the gB-field intrinsic to the ferromagnetic action. Here the factor g is introduced to show that what we normally regard as the B-field is enhanced by a factor g but the gB field is offset by the A-field reaction. Rigorous analysis, as shown in the referenced APPENDIX, proves that g must be the factor 2 and that the A-field is a halving reaction effect which makes the resultant field appear to be simply of intensity B.

Figure 6:
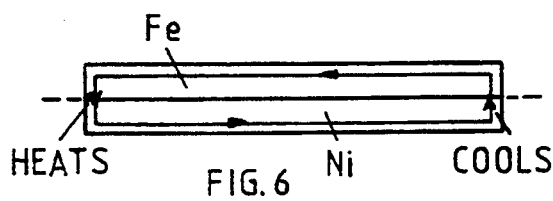
FIG. 6 shows how the reacting current will heat and cool different parts of a metal interface in a bimetallic lamination.

Imagine now, by reference to FIG. 6, that the thermoelectric characteristics of the two metals mean that the A-field reaction current causes heating at the left-hand edge of a lamination and cooling at the right-hand edge. This sets up a temperature differential which must, in the normal way, induce Seebeck and Thomson EMFs which promote a circulation of current in the opposite sense. This current would develop a basic H-field in a direction corresponding to the net B-field and so the action could be self-sustaining and lead to a bistable system, given weak demagnetizing action resulting in over-unity feedback.

Figure 7:
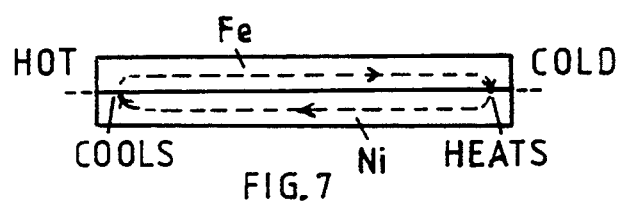
FIG. 7 shows how a temperature differential between the edges of a bimetallic lamination produces a thermoelectric loop current within the lamination.

The normal current developed by the Seebeck and Thomson Effects is portrayed by the broken line loop in FIG. 7.

Figure 8:
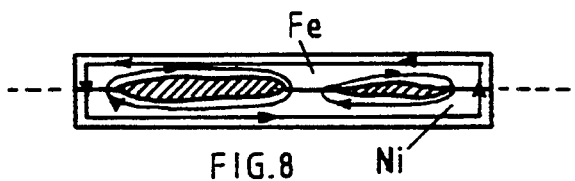
FIG. 8 shows in a ferromagnetic bimetallic lamination how non-ferromagnetic spaces between the two metals can nucleate counterflow of reacting currents which impair the effectiveness of the primary reaction.

What has been described cannot work if the interface between the two metals provides any break in the continuity of the ferromagnetic state across the metal interface. One cannot have a brazed coupling including a non-ferromagnetic metal, nor can there be any interruption which might generate parasitic counterflow of A-field current, as depicted in FIG. 8. The latter would destroy the effectiveness of the A-field heat transfer process under discussion. In these circumstances the bond between the two metals is preferably one formed by virtually alloying the metals together at the interface by heat treatment under pressure.

Nor can the action described occur if the normal Peltier EMF blocks the A-field migration across the interface. Therefore, to assure that there is some breakdown of the Peltier EMF barrier which permits supplementary junction current flow there must be some independent excitation means.

The two metals are described as being iron and nickel for the purpose of illustration and because these metals have quite distinct thermoelectric properties besides being ferromagnetic. However, it will be understood that the invention can involve any metal combination which involves a strong magnetic flux shared by substance having metallic conduction properties on both sides of the junction interface and may include a bimetallic structure that comprises different alloys and, indeed, oxides of the same metal. Note also that any good electrical conductor that has ferromagnetic properties can function in the way suggested. Certain highly conductive perovskite compositions that are ferromagnetic are known, an example being $La_{1-x}Sr_xMnO_3$, where x is between 0.2 and 0.4. The high conductivity region applies over a range of quite low temperature, but this invention has application in cryogenic work and so such compositions are feasible in certain embodiments. Also, the electropositive/electronegative features can in some cases be determined by impurity doping. If iron and nickel are used these must have opposite theroelectrical polarity over the temperature range used in applying the invention.

In principle, referring to FIG. 7, it can be foreseen that the application of heat input to the left-hand edge of a lamination with a cold heat sink at the right-edge will induce the thermoelectric Seebeck and Thomson EMFs which promote thermoelectric current flow around the loop depicted by the broken line. This sets up the H-field which in turn polarizes the B-field of the ferromagnetic metals and this, in turn, develops the half-reaction A-field and causes the current flow of FIG. 6 and with its heat transfer effect as thermal feedback.

It is evident from this description that a heat transfer device having useful properties can be fabricated simply by assembling bimetallic ferromagnetic laminations in a stack between two heat conducting plates and making provision for some kind of electrical activation transversely across the bimetallic junction interfaces. This would form a panel such as that depicted in FIG. 9. Here two aluminium plates 1 and 2 connected by heat insulating spacers 3 define a housing in which Ni-Fe laminations 4 are stacked in edge-contact with the aluminium plates. The faces of laminations may be coated with a varnish to limit possible stray thermoelectric current flow between adjacent laminations but this is not essential as the spot contact will not suffice to offset the primary A-field current action at the interfaces within the laminations. The varnish can, however, help to avoid possible electrochemical corrosion given ingress of contamination if the structure is not hermetically sealed.

In operation, given a priming temperature differential between the two aluminium plates, which constitute heat sinks for the panel assembly, that temperature differential will set up the internal thermoelectric actions which polarize the magnetic states of the lamination and activate the generated temperature differential. After initial priming, therefore, the panel should adopt one of its bistable thermodynamic states to become a panel adapted for its heat transfer role. Its function is to transfer heat from one heat sink to the other in a direction determined by that priming action and the electrical activation in the transverse sense.

To ensure that the action is sustained a periodic re-priming of the panel polarization becomes necessary. With this in mind the panel structure shown in FIG. 10 provides, within the structure of each heat sink 1 and 2, compartments in which heating resistors 5 are placed in contact with the heat sink on the side closest to the assembled stack of laminations 4. As shown in FIG. 11, these resistors form two sets 6 and 7, one on each side of the panel 8, which are separately wired so as to connect with an electrical power source 9. By energizing one or other set of heating resistors, selected by operation of the two-way switch 10, the thermodynamic polarization of the panel can be changed, owing to the reversal of the magnetic polarization arising from the thermoelectric actions internal to the laminations.

In FIG. 12 a tubular form of the invention is illustrated. Here there is a tubular core 11 which is of metal and provides a locating support for the ferromagnetic laminations 4. The latter have annular form in this case so as to present an outer cylindrical surface when assembled in a stack centred on the core 11.

FIG. 12 shows a switch 12 and electric power supply 13 connected to feed electric current through the core 11. Depending upon the design this current can either be intended to heat the tube and provide the priming needed to activate the A-field reaction current, as by connection through heating resistors as already described, or it can be intended as a magnetizing current which sets up the unidirectional field directed circumferentially around the axis of the core 11. Such a field would be directed parallel with the laminar planes of the laminated assembly and it would be transverse to the radial temperature gradient in the structure.

In operation, the A-field reaction current will activate heat transfer between the tubular core and the outer cylindrical surface of the stack of laminations 4. A fluid flowing through the core of the tube, as depicted by the arrows, can be the means for facilitating heat exchange involving external apparatus.

It will be understood that the power supplied through the switch 12 need not be continuous. The role of this power supply in the embodiment here described is to prime the operation of the device. Therefore, initial priming when it is intended that the device should be made operational may suffice, but periodic repriming can be a design feature. This is not described in detail because it is deemed obvious how this can be implementated to those skilled in the electrical control art.

It is to be noted that a separate D.C. power supply such as 13, but connected between the ends of the tubular core, could be used to establish a D.C. potential through what is, in effect, a capacitor stack 4, because the laminations are insulated from each other and the insulation serves as a capacitor dielectric. The advantages of this will become apparent as the description progresses to FIG. 29, the distinction being that the showing in FIG. 12 provides a magnetic field control, whereas the alternative is to provide an electric field control.

FIGS. 13 and 14 illustrate a structure in which a multiple-panel assembly comprising the panel form shown in FIG. 9, which has no in-built provision for electrical resistor heating, can have a magnetic field control.

The panel assembly comprising panels 8 forms a structure held together by heat insulating spacers 14. There is provision for flow of a warm fluid in one direction through the spaces between one sequence of adjacent panels and for the flow of a cool fluid through the spaces between the intervening sequence of adjacent panels. The whole structure is surrounded by a magnetizing coil 15 which is not close-wound and so this permits through passage by the fluid.

In operation, the determination of the direction of the d.c. current flow through the magnetizing coil 15, will establish the magnetic priming of the bimetallic laminations built into the panel. Provided, with this magnetic mode of priming, the laminations are assembled in the panels so as to be in a Fe:Ni*Fe:Ni*Fe:Ni*Fe:Ni etc sequence, where the (:) symbol implies contiguous metal contact and the (*) implies a barrier to A-field current, then the heat transfer will be in the same direction for all laminations in a panel.

It is, however, possible to have transverse current flow through the laminated assembly, and this offers the advantage of being able to tap into the Peltier EMF and generate external electrical power from heat fed into the assembly or, conversely, operate the assembly as a heat pump by feeding input electrical power.

In this case, the (*) would symbolize a non-ferromagnetic electrically conducting interface contact. For example, a tinned connection or a copper interface joining the laminations would preclude the A-field reaction current whilst admitting one to tap into the Peltier EMF generated current. This requires a system which encourages current to flow transversely across the laminations so as to exploit the negative resistance effect which the thermoelectric activity implies.

Figure 15:
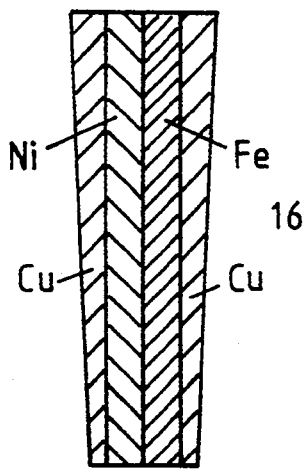
FIG. 15 shows the structure of a laminar metal segment as incorporated in the assembly of FIG. 16.

A structure implementing this is illustrated by reference to FIGS. 15 to 19. FIG. 15 shows a preformed laminar segment 16 which comprises a nickel plate (Ni), heat-and-pressure-welded to an iron plate (Fe) to form the basic ferromagnetic bimetallic lamination. The surfaces are plated with a thin layer of copper (Cu) which is configured so that the segment 16 can be joined to similar segments to be built into an annular all-metal assembly 17.

Figure 16:
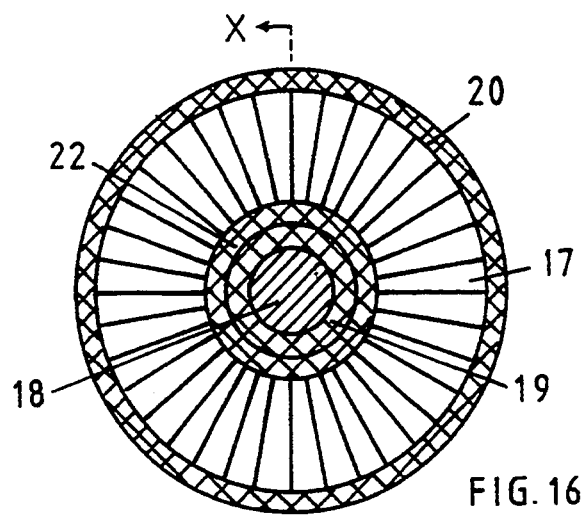
FIG. 16 depicts apparatus in which a multi-segment all-metal laminated assembly forms a short-circuited single loop conductor turn around an electrical transformer core.

The latter is assembled, as shown in FIG. 16, as a single-turn closed winding on a transformer core 18. It constitutes a single turn winding on what is, effectively a current transformer. The coupled winding 19 provides the higher-voltage, lower-current transformer connection with an external electrical power circuit illustrated in FIG. 19.

Figure 17:
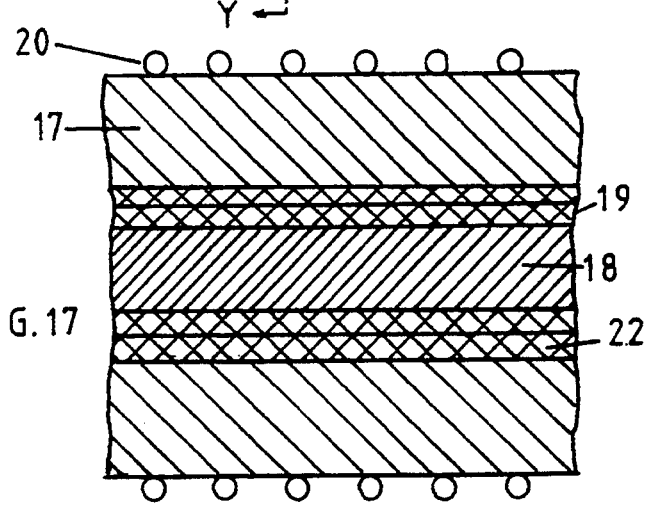
FIG. 17 shows a sectional view of the assembly of FIG. 16 through the section depicted X-Y.

To provide a priming magnetic field control a further magnetizing winding 20 forms a solenoid around the assembly 17. This is not close-wound, as shown in FIG. 17, so as to permit heat transfer across the outer cylindrical surface of the assembly 17. Winding 20 is powered by d.c. supplied via a rectifier 21. Rectifier 21 also supplies d.c. to another solenoidal winding 22 on the transformer core 18. The latter winding carries the same d.c. current as winding 20 and is oppositely wound with the same number of turns, so that it produces a d.c. backfield exactly cancelling that produced by winding 20. This means that the combined action of windings 20 and 22 does not develop a d.c. bias field in the transformer core, but there is a unidirectional field acting on the assembly 17 and directed along its central axis. Therefore, the field is at right angles to the radial direction of heat flow through the laminated assembly 17 but also is directed parallel with the planar surfaces of the laminations. As a result, the A-field reaction develops currents which tend to flow in closed circuits in the ferromagnetic sections in each of the elements. These currents cause heat transfer thermoelectrically, which in turn develops the Peltier EMF and a circulating Thomson EMF-driven current.

Figure 18:
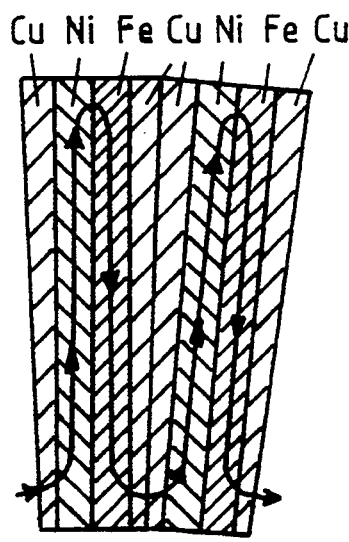
FIG. 18 shows how a current will snake around within the laminar segments of the laminated assembly in FIG. 16, deflected by the combined action of the Peltier EMFs across the metal junctions and the loop currents which circulate when a temperature gradient and a magnetic field are present.

When the transformer is energized with current flowing clockwise around the single turn winding formed by laminated assembly 17, the combination of this current with the circulating Thomson-EMF currents together form a snaking current flow, as shown in FIG. 18. The current crosses the Ni:Fe junctions at the outer perimeter of the assembly, travelling from nickel to iron. If the current in the transformer winding formed by assembly 17 is exactly matched in strength to the circulating Thomson-EMF loop currents, then, apart from the A-field current, which can not be deflected by the transverse current disturbance, there need be no current flow from nickel to iron on the inner part adjacent the transformer core. However, there will be flow of that current, with support from the Peltier EMFs across the junctions, through the Fe*Cu*Ni sequence of metal at each intervening junction. This will develop heat in the inner part of assembly 17 adjacent the transformer core, just as there will be cooling owing to the Peltier Effect at the outer parts of assembly 17. The Carnot efficiency is a limiting factor in this heat transfer process but the energy balance of this action produces a negative resistance in the single transformer turn formed by assembly 17 and the power generated transfers into the output winding 19, which serves as a secondary winding. Meanwhile, the A-field currents in the nickel-iron bimetallic laminations transfer heat from the main body of the assembly 17 to the Ni:Fe junctions adjacent the perimeter of the assembly.

By reversing the d.c. control currents in windings 20 and 22, using reversing switch 23 the magnetic polarization of the assembly 17 is reversed and so the thermal action is reversed. Now, since the transformer operates as an a.c. device, the independent reversal of current in the single turn winding formed by assembly 17 will not affect the heating and cooling action. This becomes an anticlockwise current in the sense of FIG. 18 but it merely shifts the heating at the inner parts from one set of junctions to adjacent junctions and, similarly shifts the cooling at the outer parts. The snaking current merely repositions each time the transformer current reverses. Therefore, the independent control provided by the operation of switch 23 has an role unrelated to this action at the transformer frequency. It can change the system from one which converts heat energy into electricity to one which acts as a heat pump to convert electricity into an efficient transfer of heat.

Figure 19:
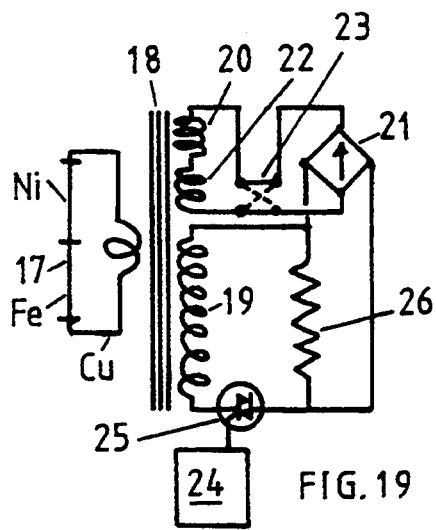
FIG. 19 shows schematically an electrical circuit by which the apparatus of FIG. 16 can be used as a heat engine to convert heat into electricity and vice versa as a heat pump.

In FIG. 19 an electrical control unit 24 comprising an oscillator provides a control for the SCR (silicon controlled rectifier) device 25 which determines the cyclic operating frequency of the system arid the resistor 26 denotes an output load, which in the heat pump mode of operation would be replaced by an input electrical power source.

The above description aims to show how a bimetallic lamination comprising two ferromagnetic metals can provide a new technological way of converting energy from heat to electricity and vice versa. There are many different ways in which the laminar structure provided by this invention can harness the new principles involved and serve a useful purpose. Also, as already suggested, there are many metal combinations, or combinations of substances having metallic conduction properties, which can function in the way described. Also, one need not have a strict interface between the two metals. The transition of metal type could be graded if, for example, the lamination comprises a single base ferromagnetic metal form into which 'impurities' of different nature are loaded on opposite faces. If the metal lamination could be made n-type on one side and p-type on the other, so that Thomson Effect acts to cause currents to flow in opposite directions to set up the circulation, then that would become a bimetallic ferromagnetic lamination in the sense intended in this specification. The equivalent to this would be to convert a ferromagnetic base metal lamination into different alloy forms on different sides by suitable heat treatment and metal processing. However, bearing in mind that nickel and iron are spaced well apart in the thermoelectric sequence which relates their mutual Peltier EMFs, the straightforward choice in implementing this invention is to use two metals which are predominantly nickel and iron, respectively.

An example of a material for which the polarity of the coefficient governing the Thomson Effect reverses sign according to the amount of free arsenic or impurity present is manganese arsenide. As reference, see pp. 370–371 of L. F. Bates' book 'Modern Magnetism' (4th edition) published by Cambridge University Press (1961).

It should be noted that the structures described would normally have a greater heat transfer rating than the capacity of the heat sinks for removing and feeding that heat. This problem can be taken into account in the design by reducing the operative cross-sections of the active bimetallic components. For example, one could use nickel and iron thin ferromagnetic film layers on a non-metallic substrate to build the structures shown in FIGS. 9, 10 and 12. In the case of the structure of FIG. 16, where electrical conduction from layer to layer is needed, the reduction in section could be introduced by segmenting the structure along its axial length. Electric current does not flow through assembly 17 parallel with the axis central to the transformer core. Therefore, the segments could be assembled into thin annular elements by printing metal coatings on heat insulating disc substrates of appropriate thickness. This would downgrade the power rating but that could be necessary owing to the limitation of heat transfer rates over the operational surfaces.

Having described above embodiments of the invention in which the ferromagnetic activation plays a role in enhancing thermoelectric feedback, the remainder of this description will focus on the transverse electric field activation as the priming function.

Figure 20:
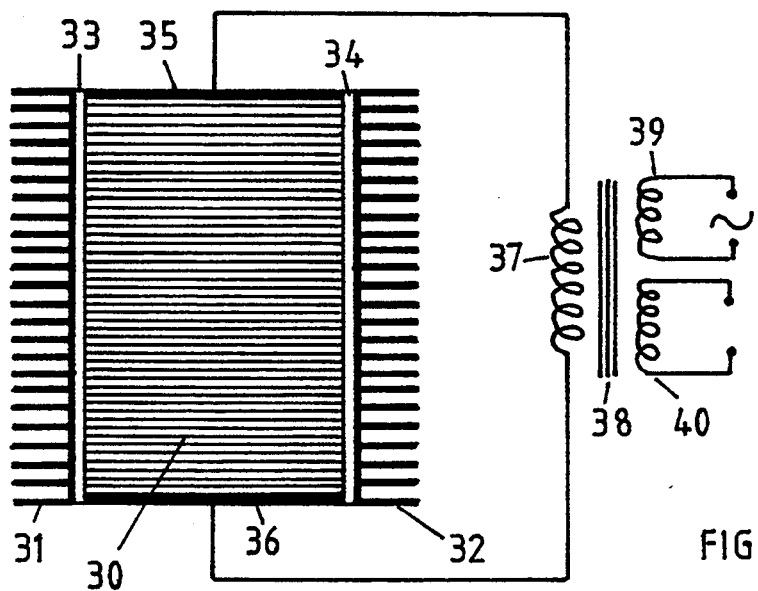
FIG. 20 shows a laminated assembly positioned between two heat sinks with provision for transverse alternating electric field excitation from an electrical transformer.

Referring to FIG. 20, a laminar stack comprises a multiplicity of planar elements, each of which consists of bimetallic layers and an insulating layer. The elements may be formed by depositing metal coatings on an insulating sheet substrate material such as a high dielectric constant polymer, and structure suitable for low temperature operation or by forming the insulating layer, as by oxidation or special coating on a surface of a bimetallic substrate. The latter will be more suitable for operation at high temperature.

It is most important that the insulating material should have a very high electrical breakdown potential gradient. This is more important than the need for high dielectric constant, inasmuch as in the priming role to be described the action at the thermocouple junction is not dependent upon the electric charge but rather upon the voltage gradient.

The latter point is stressed in order to draw the distinction between the embodiments in which there is need for a high current oscillatory throughput in what is a capacitor stack. In the following description the object is to use the priming voltage in the capacitor as a catalyst regulating the thermoelectric junction interface by a bias action which offsets or augments the Peltier EMF between the two metals. Here the object is to secure advantages from the thermodynamic feedback with current action confined to a closed circulation local to each junction interface.

The stack 30 is assembled so that it comprises an alternating layer sequence A-B-d-A-B-d-A-B-d etc, where A and B are the two substances forming the bimetallic elements and d denotes the dielectric insulating separation layers. The stack 30 is located between two heat sinks 31, 32 and electrically insulated from those heat sinks by heat conducting barriers 33, 34. Metal end plates 35, 36 serve as capacitor electrode terminals by which the capacitor stack is electrically activated.

The thicknesses of the metallic layers A and B and the insulating layers are determined by design criteria based on the principles to be explained below. Typically the dielectric layer may be 20 microns in thickness, whereas the metal layers can be of the order of 0.1 micron thickness or one hundred of microns, depending upon the method of electrically activating the stack and the power rating.

In the arrangement shown in FIG. 20, the stack 30 is connected across a winding 37 on a transformer 38 to couple inductively with winding 39 and winding 40. The stack 30 depicted in sectional end view forms part of apparatus such as that shown in plan view in FIG. 21 or that shown in sectional plan view in FIG. 22. The arrangement is such that two core sections of a closed magnetic circuit are formed by two stacks of the form shown in FIG. 20. Magnetizing windings 41, 42 are supported on core end sections 43, 44 of insulated iron laminations or of ferrite blocks. These end sections form the magnetic flux closure circuit by which a magnetic field can be set up through the two stacks.

Figure 21:
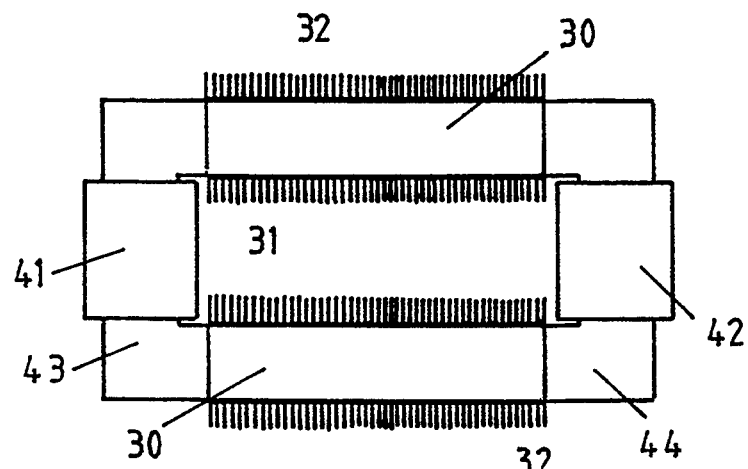
FIG. 21 shows how the laminated assembly may be included in apparatus having a magnetic core circuit with windings by which a magnetic field can be applied to the stack mutually orthogonal to the heat transfer direction and the transverse electric field excitation shown in FIG. 20.
Figure 22:
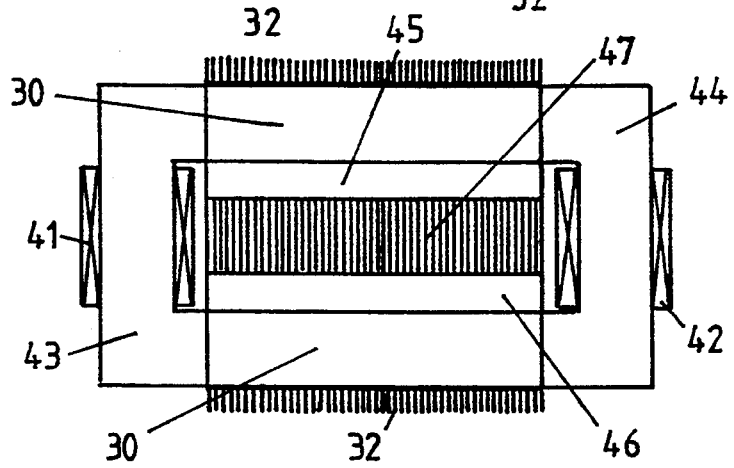
FIG. 22 shows a heat pump apparatus based on FIG. 21 but having internal heat sinks which heat and cool respectively in relation to the temperature of external heat sinks, and incorporating between the internal heat sinks apparatus which generates electricity from the temperature difference of the internal heat sinks.

The apparatus shown in FIG. 22 differs from that in FIG. 21, by having solid heat sinks 45, 46 on the inner sides of the stacks 30 and by virtue of these heat sinks 45 and 46 also forming part of a separate thermoelectric power converter 46.

The two stacks 30 in the FIG. 21 arrangement have connections to a transformer such as that denoted 38 in FIG. 20, which assure that the A.C. electric activations of the stacks operate in a phase relationship assuring that the internally facing heat sinks 31 are in the same heating or cooling mode, whereas the stacks 30 in the FIG. 22 arrangement are connected to a transformer to have a phase-excitation relationship which results in the externally facing heat sinks 32 having opposite heating or cooling modes. The connection circuitry needed for such activation is not shown, but is deemed to be obvious to those skilled as electrical technicians, whereas the design principles involved will be evident from the above description of the heating and cooling actions in relation to direction of the priming magnetic field produced by excitation of windings 41 and 42.

To understand the operating principles involved in these two arrangements, particularly as concerns the electric field action, it is necessary to digress at this stage to discuss the physics of the subject.

As a preliminary, it is important to take note that, contrary to general belief, even amongst professional electrical engineers, it is possible to set up electric fields within a metal. Also, a metal, though highly conductive electrically, has a dielectric constant that differs little in value from that expected from ordinary insulating substances.

A primary reference to an authoritative source on this point is that of the physics textbook by Max Abraham and Richard Becker entitled: "The Classical Theory of Electricity and Magnetism" (published by Blackie & Son Ltd, London) in 1932. Quoting from p. 190 of that work:

"With regard to the dielectric constants of metals, there is at the outset the difficulty that the customary electrostatic methods for determining them are not applicable".

The authors then explain that the dielectric constant of metals is deduced from their optical behaviour, meaning their response in governing electromagnetic wave penetration. The point is that the charge carriers in the metal are subject to displacement effects which imply the presence of electric fields.

Now, in a practical device, one can similarly set up electric fields in a metal rotor by displacing those charge carriers, either by inertial action or by the action of a magnetic field directed along the spin axis. However, even here physicists have problems understanding the phenomena they observe, as one may see from the scientific paper by James F. Woodward: "Electrogravitational Induction and Rotation", Foundations of Physics 12 467–478 (1982). On p. 472 one reads, after a statement that machine operation produced induced charge in evidence from a voltage:

"Plainly, an effect of some sort is present. Since a negative charge appears during spindown, we may infer either that (1) an initially present positive charge disappears during spindown, or (2) some process drives the sample case to negative potentials during spindown. The genuine disappearance of charge from the sample/sample-case assembly would be, of course, prima facie evidence for the existence of electrogravitational induction."

What this means is that electric charge can be held displaced within a metal to set up electric field gradients in that metal. Woodward did this by inertial spin action, possibly affected by extraneous magnetic fields, such as the earth's field, but a similar result can be obtained by building a series-connected capacitor stack.

By this is meant a structure in which an isolated metal sheet is trapped between two layers of dielectric insulating material, the outer surfaces of which are metallized.

When an electric potential is applied between the two outer layers to charge this two-sectioned series-coupled capacitor the free charge carriers in that intermediate metal sheet are displaced to one face of that sheet. There is no surplus free charge able to flow in through a metal connection, because that metal sheet is isolated in that sense, apart from leakage effects. Thus, subject to the slow leakage of neutralizing charge, that metal sheet comprises atomic sites from which the free charge (whether as negative electrons or as positive holes, according to whether the metal is electronegative or electropositive) is displaced to settle at one of the metal surfaces. The polarity of the charge on the capacitor stack determines which surface attracts those free charge carriers, but their displacement means the presence of an electric field within that metal.

However, generally, owing to the high electrical conductivity of metal the displacement of charge is such that a uniform electric potential applies throughout the metal. There is, nevertheless, an effect of change of potential at the junction between two metals, because the charge carriers have different populations in the two metals and their thermal motion near the interface boundaries results in a graded adjustment of their mutual equilibrium. The result is that a potential difference occurs that is temperature dependent. This is the basis of thermoelectric effects, because the flow of current through such a potential difference can result in heating or cooling according to current direction and current can flow because the metal in electrically conductive.

The invention we are concerned here requires the recognition that such a field can be set up in metal in a supplementary way which has no primary dependence upon temperature, although the usual temperature-dependent Peltier action is still present and accounts for a separate field component.

Figure 23:
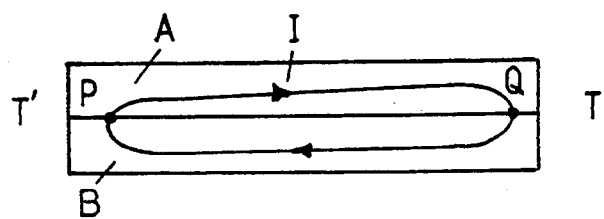
FIGS. 23 to 27 show cross-sections of bimetallic laminations subjected to a temperature difference with different modes of thermoelectric, induced and transverse current flow.

To summarise this, refer to FIGS. 23 to 27. FIG. 23 shows how a temperature T' at one edge of a bimetallic lamination composed of metals A and B of opposite Thomson coefficients will interact with a lower temperature T at the other edge to cause a current circulation of strength I. There is cooling at P and heating at Q.

Figure 24:
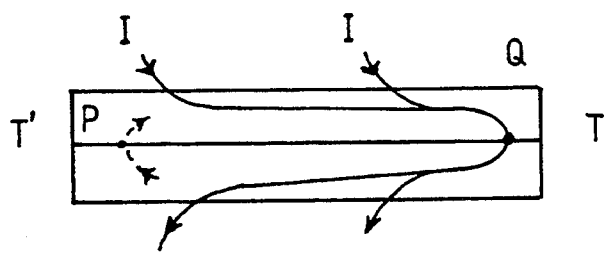
Figure 25:
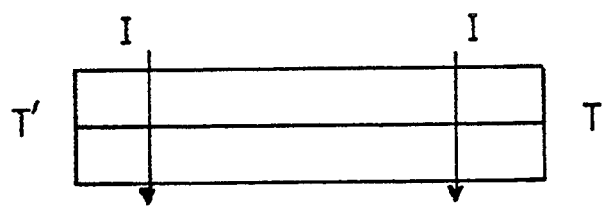

FIG. 24 shows the effect of a transverse current of strength 2I. This current is deflected through Q whereas the circulating current is suppressed. From a circuit design viewpoint the transverse current is as shown in FIG. 25 but spread over the very large cross section as I on the left hand side merely cancels the upward thermoelectric current I at P and I on the right hand side adds to the thermoelectric current I at Q. This means that there is very little joule heating and the full 2I of current provides Peltier heating at Q. Of course, if the 2I transverse current reverses, then the action involves the full measure of cooling at P, with no heating at Q.

Figure 26:
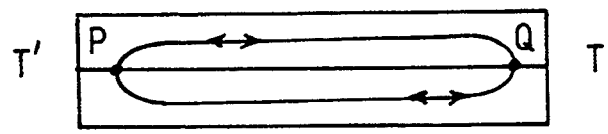

Now consider FIG. 26 and assume that an alternating magnetic field is active as if the lamination were built into a power transformer and subject to eddy current induction. The bimetallic lamination would now involve cyclic heating alternating with cooling at both P and Q and this would not have any technological benefit.

Figure 27:
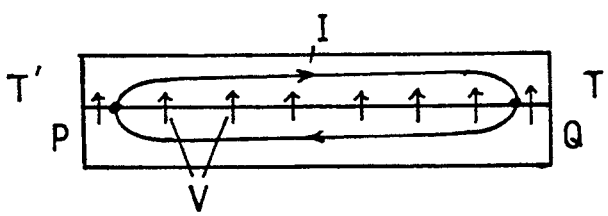

However, imagine further that whilst the eddy-current I flows clockwise, as shown in FIG. 27, there is an upwardly directed field gradient across the bimetallic junction interface which, over the mean free path of the charge carriers, amounts to a potential difference V.

Here, the presence of V in the direction shown, assuming The clockwise direction of current is also that of the normal thermoelectric action with T' greater than T, will mean augmented cooling at the rate VI at P and augmented heating at the rate VI at Q.

The invention in one of its aspects then provides that V should be reversed in direction as the eddy-current I reverses, so that V and I, neither of which depends upon the conventional thermoelectric properties of the metals, always cooperate to cause cooling at P and heating at Q at the rate VI and regardless of the polarity reversals.

The only reason for having the bimetallic interface is to set up that potential V.

Figure 28:
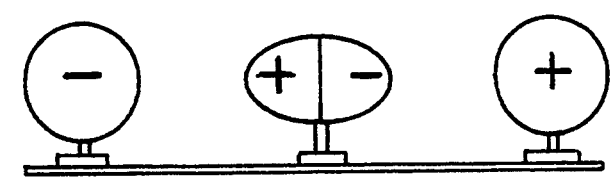
FIGS. 28 and 29 show electrostatic induction arising from charge displacement across an interface between metals of opposite polarity.

To understand this consider one of the most basic demonstrations of charge displacement in metal by reference to FIG. 28.

Here a copper oblate spheroid comprises two parts which can be together in contact or pulled apart. A positively charged electrode is brought close to the right hand side of the uncharged oblate spheroid. For symmetry a negatively charged electrode may also be brought close to the left hand side of the oblate spheroid. This causes charge displacement as illustrated. If now the copper oblate spheroid is pulled apart one can demonstrate how one half carries with it a positive charge and the other a negative charge.

There is, of course, no potential within the copper oblate spheroid in spite of the presence of the charges, because the latter concentrate over surface regions.

Now, in an alternative scenario, imagine that the copper oblate spheroid is really composed of two parts which have different free charge carrier properties so that the displacement in one involves positive charge carriers and that in the other involves negative charge carriers. The above experiment would then fail because in each part the displaced charge would not penetrate the junction interface.

Figure 29:
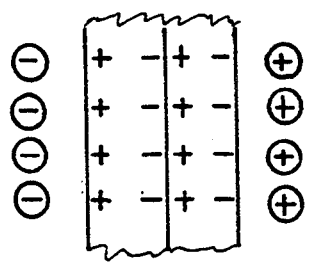

The action would be as depicted in FIG. 29, which is now drawn to represent a laminar bimetallic structure. This means that the charge displacement which can be brought about by sandwiching this bimetallic laminar structure between two dielectric sheets having outer plate electrodes, will have a counterpart at the junction interface. There will be the same voltage gradient across that interface region as there is in the dielectric sheets if the dielectric constants of the sheets and the metals are the same.

In a practical situation this can be of the order of 10 million volts per meter and, over a mean free path distance of, typically, 0.1 microns, this means a 1 volt value for the potential drop across the junction interface. If V is 1 volt, this can be ten times greater than the normal Peltier EMF across the interface at room temperature. Thus the heating and cooling effects can be ten times greater than the conventional thermoelectric action. However, note further that the current circulation can be eddy-current, which is controlled by the externally applied rate of magnetic flux activation in the lamination and this, in turn, can be many times greater than that powered by a closed thermoelectric circuit.

This, therefore, gives basis for the operating principles of the arrangements shown in FIGS. 20–22. Essentially they are power transformers assembled from bimetallic laminations comprising metals of opposite charge carrier polarity and provided with heat sinks. The input power acts as a catalyst to transfer heat. Essential to the operation is the in-phase cyclic operation of the voltage applied transversely and the eddy-current induction currents produced by normal inductions.

It is possible to use the energy converter apparatus shown in FIG. 21 to convert input heat directly into electricity, inasmuch as the stack 30 will have a negative resistance when there is a temperature differential between the heat sinks. Thus oscillations in the stack can occur, drawing on input heat to deliver power at the oscillation frequency through the winding 39. This is basically the action in the prototype devices tested by the Applicant. However, the oscillations can decay sporadically to arrest the action unless the circuit is highly-tuned to resonance or some 'pace-maker' feature is incorporated. Hence the winding 40 can be excited by an oscillator input at the control frequency, controlled at a voltage level and phase, in relation to the output from winding 39, which ensures that no input power is supplied so long as the thermally activated power output is at the operational level.

Reverting, however, to the basic heat pump mode of operation, FIG. 21 depicts apparatus in which the excitation of windings 41 and 42 with alternating current at a frequency that can be, say, 1 kHz will generate eddy-currents in the thin bimetallic laminations within the stacks 30. The end pieces 43 and 44, which are of ferrite, will not involve significant eddy-current losses and their hysteresis loss will be minimal because their cross-sections are much larger than those of the ferromagnetic laminations in stacks 30. This is because there is dielectric insulation in the stacks and also, as a design requirement, some infill insulator to restrict direct heat conduction loss between the heat sinks.

By connecting the output from a transformer 38 to power both the magnetizing current and a priming voltage across the stacks 30, and, noting that eddy-currents draw on primary current input having a phase that matches that of the applied voltage, one sees, from the foregoing explanation, that the system will operate to cool one heat sink and heat the other on each stack 30.

The FIG. 21 arrangement therefore can be used to heat up the air or a fluid flowing through the internal channel formed between the two stacks 30. The action involves external cooling and so the system operates as a heat pump powered by the A.C. fed to the transformer.

It will be understood from this description that power from the priming voltage source will add impetus to the current at the heated heat sink and, conversely, such power will be returned to the priming voltage source by retarding the current action adjacent the cooled heat sink. In other words, given that there is that circulating current and that polarizing voltage gradient, one can see how they jointly cooperate in developing heating at one heat sink and precisely the same amount of cooling at the other heat sink.

Now, nothing in what has just been said requires the conventional thermoelectric action we associate with the Peltier, Seebeck or Thomson Effects. The latter owe their existence to the thermal interactions occurring between charge carriers and they relate specifically to the temperature conditions which prevail and are different at the two heat sinks. For the latter reason, these thermoelectric actions involve a difference in heating and cooling power on the two sides of a thermoelectric device, a difference which determines a Carnot-type efficiency restriction of energy conversion. However, such action occurs with unidirectional current circulation.

In contrast, the action described above, which is an oscillatory current action, is one where the priming electric field is merely a catalyst in the transfer of heat energy and that has no Carnot limitation. Even so, the circulating loop current will involve some ohmic heating loss, but this will be very small in relation to the heat transfer if the induced EMF powering the current circulation is very much less than the estimated 1 volt drop owing to the potential V priming the junction interface.

The invention, therefore, aims to exploit this very high efficiency potential for operating a heat pump with no Carnot restriction. The power needed to operate the device is that needed to sustain the circulating current.

Given that the Carnot efficiency is not limiting it will be understood that the invention elevates heat energy from a low to a high temperature, meaning that ambient heat input to one heat sink can be a base source for generating cooler or hotter conditions at the other heat sink. If this action avoids the Carnot limitation then one can foresee the utilization of a conventional heat engine, such as a Stirling engine or a steam engine using the Rankine cycle, in back-to-back coupling to generate electricity sufficient to power the primary thermoelectric energy converter.

The result of such a combination is a technology which can harness ambient environmental heat from the atmosphere to deliver power to a steam turbine and so an electricity supply. This may seem to be impractical, but the barriers posed by the second law of thermodynamics are no longer to be regarded as a block on innovation and technological progress. Energy is conserved, but ambient heat energy serves as the active input which is converted into the same amount of heat at a higher temperature.

The following references may help to clarify that such a prospect has justifiable scientific foundation. The Maxwell demon, a topic regularly discussed by physicists, was seen as doing no work but trapping gas molecules in one or other of two compartments according to their heat energy state, thereby heating one compartment and cooling the other, with no expenditure of effort.

It has long been the belief of many physicists that a way to implement the role of the Maxwell demon can be found. A very recent statement on this subject is that of Kechen Zhang and Kezhao Zhang Physical Review A 46, 4598–4605 (1992). They prove that mechanical models by which to breach the second law of thermodynamics are, in principle, a possibility. The question turns on devising machines which support what they term "robust momentum flow".

Thus, in the device just described, there is the overlap of two circuital electrical actions which interfere and combine in a way which sets up a "robust electrical momentum flow", meaning not simply a standing oscillation. The "robust" aspect of electrical momentum applies not to I or V but to their product VI, which is an expression of energy in motion. It is robust in the sense that the flow is always such as to transfer heat from P to Q in FIG. 27.

The Applicant has, independently, drawn attention to what some might say was a breach of that second law of thermodynamics, as the subject of U.S. Pat. No. 5,101,632 dated Apr. 7, 1992. This shows how optical focusing of photons can cause heat radiation to climb up a temperature gradient. In this earlier disclosure a multicell mirror structure constitutes the device which, in this subject invention, is replaced by a thermoelectric system. The essential point to keep in mind is that the true law of thermodynamics is formulated with the qualification that denies that heat can climb up a temperature gradient 'of its own accord' or by 'self-action'. Once, optical focusing, which is not subject to temperature, is introduced there is interference in the path of heat flow and this upsets the law, just as the catalytic effect of an oscillating tranverse electric field can act on oscillating eddy-currents to divert heat from P to Q in FIG. 27 without being constrained by temperature.

The possibility of setting up a temperature differential between two heat sinks by the cooperative catalytic action of eddy-current excitation, without any Carnot efficiency limitation, therefore allows a power converter such as that shown in FIG. 22 to be combined, with advantage, in a combination back-to-back with an electric power generator powered by heat, but subject to the Carnot limitation.

Thus in FIG. 22 the stacks 30 are excited so that the solid metal heats sinks denoted 45 and 46, heat and cool, respectively, in relation to the external ambient temperature of heat sinks 32. Then, between the solid metal heat sinks 45 and 46 there is a laminated capacitor stack assembly 47 which is the functional core of a power converter of the form described in the above-referenced copending U.S. patent application Ser. No. 07/439,829, now U.S. Pat. No. 5,288,336, also the subject of corresponding GB Patent No. 2,227,881B.

This combination can serve to operate, using only sufficient electrical power input to activate the catalytic heat transfer functions in stacks 30, drawing on ambient heat sources, whilst delivering electrical output power derived from that heat.

There is another way in which the V potential priming action can serve in the energy transfer process by feeding in electric power to sustain current flow through the junction interfaces in the laminar capacitor stack.

This uses the combination of a D.C. potential and an A.C. current. The potential develops the V potential across the bimetallic junction interface. The A.C. current flows transversely down the stack and is matched in strength with the thermoelectric circulating current in each lamination, as discussed by reference to FIG. 24. This develops the necessary heat transfer action associated with the Peltier Effect and subject to the Carnot efficiency limitation, but, in addition, since the current which does cross each junction is, on a time average, essentially unidirectional, there is a supplementary heat transfer action associated with V. The latter is not subject to the Carnot condition.

Figure 30:
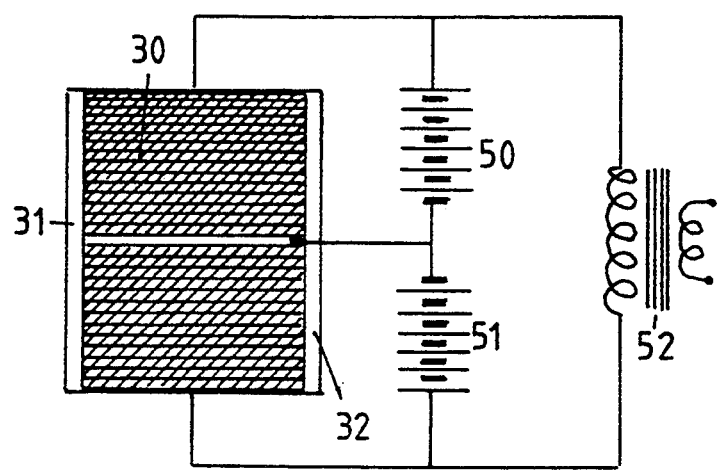
FIG. 30 shows a laminated stack assembled between two heat sinks and connected to different voltage potential sources which provide a controlled mix of direct and alternating transverse field excitation in the stack.

FIG. 30 shows a schematic arrangement by which such a technique can be implemented. The D.C. battery units 50, 51 are arranged back-to-back with a midpoint connection to bimetallic capacitor stack 30, the latter being built in two sections. The upper section involves layers of aluminium and nickel upon a polymer insulating substrate and the upper section has these layers inverted. This inversion is to match the reversal of V as between the upper and lower sections of the stack. In practice suitable D.C. power sources other than the back-to-back battery combination would be used, as persons skilled in the electrical art would understand, the object being to preclude direct current flow through the secondary winding of transformer 52.

In operation, with the amplitude of the D.C. component being appreciably in excess of the amplitude of the A.C. voltage as seen across each half of the bimetallic capacitor stack 30, the A.C. power will feed A.C. current through the stack which establishes and sustains a thermoelectric Peltier heating and Peltier cooling of the respective heat sinks 31 and 32. However, the D.C. voltage which is sustained with negligible power drawn from the batteries 50, 51, will act as a catalyst in enhancing the transfer of additional heat between the heat sinks as V interacts with the circulating thermoelectric current I at each junction.

Essential to this operation is the need for the two metals of the bimetallic laminations to be electropositive and electronegative respectively and for each such lamination to be electrically isolated. The latter condition is essential in order to assure that the displacement of electric charge associated with the D.C. charging of the capacitor stack occurs inside each lamination with no inflow of outflow by leakage.

Figure 31:
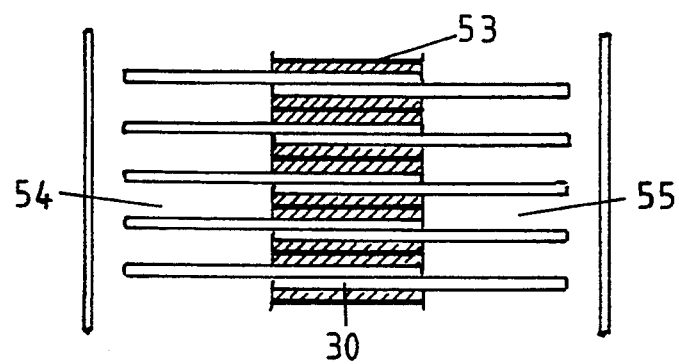
FIG. 31 and 32 show different sectional elevation views of an assembly of bimetallic laminations with electric insulation locating the laminations between capacitor electrode plates with provision for thermal heat exchange between the laminations, the fin-like extensions of which form heat sinks, and fluid flow channels for heat transfer.
Figure 32:
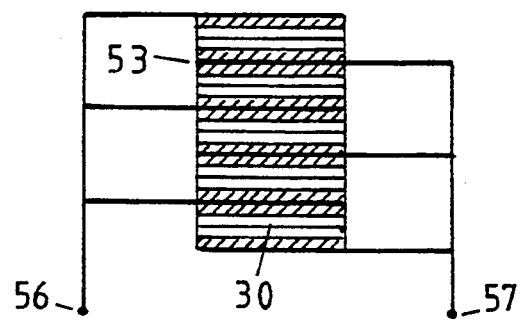

FIG. 31 and 32 show different sectional side elevation views of a bimetallic capacitor stack 30 having heating and cooling fins which constitute heat sinks and which are extensions of the two metals used to form the stack. The shaded elements represent dielectric insulating layers which, in this case, form part of a multilayer sandwich between capacitor plate electrodes 53. In FIG. 31 the heating and cooling metal fins are coated with electrical insulation, as by a varnish, and are situated in the flow paths 54, 55 of fluids which circulate within on external heat transfer system.

In FIG. 32, the connections linking the capacitor plate electrodes to form a composite parallel-connected capacitor system are shown. The terminals 56, 57 provide the capacitor circuit connections and are powered, as by being one part of the two part system having the battery-cum-transformer connection shown in FIG. 30. There may be several bimetallic laminations, all insulated from each other, assembled between a pair of capacitor plate electrodes 53.

The purpose of FIGS. 31 and 32 is to show how electrical connections can be made for powering the capacitor stack directly and to show that the heat transfer surface through an insulator can be enlarged to enhance the overall heat transfer efficiency.

In summary, this description has covered magnetic catalytic action with thermal power input priming, electrical potential catalytic action with thermal power input priming, electrical potential catalytic action with eddy-current power input priming and electrical potential catalytic action with direct transverse alternating current input priming. All these are deemed to be alternatives within the spirit of a common invention which forms the subject of this specification.

It will be understood that in presenting this invention the Applicant has relied on evidence emerging from prototype testing to present forms of apparatus implementating the invention, but has had to speculate in some measure on the thermal feedback actions that are occurring inside the metal. The existence of a V potential across a metal interface in a bimetallic lamination through which charge is displaced by capacitor action, meaning a potential other than the Peltier EMF, is not recognized as relevant by experts on conduction theory. They see the transition distance at the interface as being of the order of the atomic separation distance in a metal lattice, because they have to reconcile such action with the work function of metals and contact potential differences which seem not to affect normal current flow across a metal interface. With this in mind, it may ultimately be shown that the V potential set up in a metal by the Nernst-Ettinghausen Effect resulting from combined actions of magnetic field and heat throughput is the more relevant in governing the operation of apparatus incorporating this invention. This, however, should not detract from the merits of a workable invention as featured in the following claims.

The following reproduces the mathematical analysis supporting the above description and which forms an Appendix to the disclosure in the claimed International Convention priority of GB Patent Application No. 9212818.0.

APPENDIX

ANALYSIS OF THE A-FIELD REACTION

To determine the strength of the A-field reaction in a metal conductor one needs to note that each conduction electron moves at a high velocity and is subject an electric potential mainly sourced in the positive residual electric charge of the atoms which have shed those conduction electrons. These atoms are locked into the metal crystal structure and so the free electrons move under the constraint of a local electric force $F(r)$ which has a component constraining the electron to move between collisions in general orbital paths of radius $r$ centred on the atoms.

If a magnetic field of strength B is also present this supplements the electric force by a component force $Bev$, where $e$ is the electromagnetic charge of the electron and $v$ its speed in circular orbit about an axis aligned with the direction of B.

Note that the force $F(r)$ is a restoring force proportional to displacement of the electron from a notional position of rest, assuming it has no motion. The restoring force factor depends on boundary shape but is the same throughout any metal structure having parallel planar boundaries, regardless of the direction of charge displacement. Its value is halved within a cylindrical metal structure provided the displacement is in a plane at right angles to the cylinder axis. In either case, displacement from $r=0$ to $r$ involves adding potential energy of $F(r)r/2$.

The force equation, assuming that B is zero, is simply:

$$F(r) = (mv^2/r) \qquad (1)$$

If one now sums the effective kinetic energy component attributable to v for all the free electrons in a unit volume of the metal and write that as energy density W, the equation gives:

$$\Sigma F(r)r/2 = \Sigma mv^2/2 = W \qquad (2)$$

Now bring in the action of the B field. This adds the force term in $Bev$ to the left hand side of equation (1) and so changes equation (2) in the following way:

$$\Sigma F(r)r/2 + \delta\Sigma F(r)r/2 + B\Sigma evr/2 = W + \delta W \qquad (3)$$

Next, note that the terms in F give rise to a potential energy and it is appropriate to bring the energy terms together on the right-hand side of the equation into a single energy density function that depends upon B. Denoting this energy density function as E, equations (2) and (3) combine to give:

$$B\Sigma evr/2 = \delta E \qquad (4)$$

The expression involving $evr/2$ is a measure of the reacting magnetic moment of each conduction electron. It develops a back-field or reaction field which is denoted the 'A-field' and which, if scaled by a factor g, has the value:

$$A = 4\pi g \Sigma evr/2 \qquad (5)$$

The B-field acting on each conduction electron is, therefore, a combined field effect produced by a primary field which we write as $gB$ and this is offset by the field of strength A. Note that the same scaling factor has been used to modify the B field as is used to modify the reaction field. Reasons for this will be apparent in what follows, but one needs to keep in mind that a unity value must be assigned to g to comply with orthodox teachings on this subject.

One can now write:

$$gB = B - A \qquad (6)$$

Combining equations (5) and (6):

$$\delta E = (gB - A)(A)/4\pi g \qquad (7)$$

which is a simple relationship representing an energy quantity which tends to maximize because its negative potential energy component tends to a minimum.

The variable in the equation is the value of the A-field. Differentiating equation (7) with respect to A shows that the energy density attributable to the B-field is a maximum when:

$$gB - 2A = 0 \qquad (8)$$

which shows that the strength of the A-field reaction is exactly half of gB and, from equation (6) this means that g is precisely 2. Then, from equation (7) this, in turn, means that:

$$\delta E = B^2/8\pi \tag{9}$$

which is the conventional magnetic field energy density formula in the units we are using.

The result of this analysis is that when a primary magnetic field acts on the free conduction electrons in a metal there is, inevitably, a half-field reaction, the A-field, which is opposed to that primary field. Since, in the past, one has been able to work with theory which presumes there is no such reaction, then the B-field which is known to be effective in the metal must owe its action to a magnetizing effect twice as strong as the B-field. The half-field reaction has passed unnoticed in experiments because one has failed to double the primary field action before halving it. Therefore, the moment of electric current attributable to the electron, which is represented by a term such as (evr/2), and which would otherwise be deemed to represent the reaction, must also be incremented by that same g-factor. This explains why the g-factor was introduced in equation (6). It makes sense of an otherwise impossible situation.

Note that the half-field reaction is sensed in gyromagnetic reaction measurements, where observation based on reversing the ordered electron activity which is associated with magnetic polarization causes a proportional reversal of angular momentum. The ratio of the electrical current moment to the angular momentum, as measured, is twice that expected from conventional theory based on the known charge/mass ratio of the electron. This gyromagnetic ratio factor of two is the g-factor deduced above. The experiment confirms the theory presented.

Note also that the interpretation of the gyromagnetic reaction in terms of the 'A-field' is indisputably strong, but it does require the concomitant recognition that there is an A-field vacuum reaction involving the charges which account for Maxwell displacement currents. This A-field reaction in the vacuum or aether is the basis on which inductive energy is stored as a magnetic field. Physicists have for most of the 20th century, at least until recent times, sought to avoid referring to the aether or recognizing it as an active energy medium, and this has been to the detriment of innovative energy technology.

I claim:

1. Thermoelectric heat transfer apparatus comprising a first heat sink, a second heat sink and a laminated assembly of bimetallic elements in each of which two ferromagnetic metals having different thermoelectric properties have electrical interface contact in a composite structure as a metal lamination, these laminar elements being arranged between the heat sinks with opposite edge surfaces in thermal contact with the surfaces of the first and second heat sinks, and adjacent elements in the assembly being assembled in interfacing electrical contact through a third non-ferromagnetic metal, all interface connections through that third metal being between different ferromagnetic metal type and the opposite non-interfacing edge surfaces of the bimetallic laminar elements of this assembly forming two surfaces across which heat may be transferred, there being external electrically powered circuit control means arranged to produce a polarizing bias at the junction interface, and there being electrically powered priming control means independent from the externally powered circuit control means by which to activate and sustain thermoelectric current circulation within each lamination by establishing a priming temperature differential between the heat sinks, whereby, when a temperature differential exists between the heat sinks and the said two surfaces, thermoelectric currents circulate between the two ferromagnetic metals in each element and the passage of electric current through the non-ferromagnetic metal of the laminated assembly and in a direction transverse to the laminations encounters a negative resistance upon entry into the ferromagnetic metal owing to thermoelectric action corresponding to the conversion from thermal to electrical energy.

2. Apparatus according to claim 1, in which the laminated assembly forms a closed circuit and constitutes a short-circuit single turn winding mounted on an electric transformer core, there being a further multi-turn winding having connections to an external electrical circuit, whereby heat transfer into and from the laminated assembly has a conversion relationship with respect to electric power carried through said multi-turn winding.

3. Apparatus according to claim 2, in which an additional magnetizing winding connected to an electrical power source which supplies a d.c. current is wound around the laminar assembly and provides a d.c. magnetic field directed in the plane of the laminations and at right angles to the gradient of heat flow through the assembly, whereby control of this d.c. magnetic field regulates heat transfer within the apparatus.

4. Apparatus according to claim 3, incorporating a d.c. powered compensating winding positioned between the laminated assembly and the transformer core and supplied from the same power source as the aforesaid additional winding but designed to have the same number of oppositely-directed ampere-turns so as to shield the transformer core from the d.c. field present in the laminated assembly.

5. Apparatus according to claim 1, in which the two ferromagnetic metals comprise nickel and iron.

* * * * *